(12) United States Patent
Wang et al.

(10) Patent No.: US 12,063,776 B2
(45) Date of Patent: Aug. 13, 2024

(54) FLASH MEMORY LAYOUT TO ELIMINATE FLOATING GATE BRIDGE

(71) Applicant: Taiwan Semiconductor Manufacturing Company, Hsinchu (TW)

(72) Inventors: Shun-Neng Wang, New Taipei (TW); Tung-Huang Chen, Taichung (TW); Ching-Hung Kao, Tainan (TW)

(73) Assignee: Taiwan Semiconductor Manufacturing Company., Ltd., Hsinchu (TW)

( * ) Notice: Subject to any disclaimer, the term of this patent is extended or adjusted under 35 U.S.C. 154(b) by 0 days.

(21) Appl. No.: 17/714,231

(22) Filed: Apr. 6, 2022

(65) Prior Publication Data
US 2023/0328972 A1    Oct. 12, 2023

(51) Int. Cl.
*H10B 41/10* (2023.01)
*H01L 21/28* (2006.01)
*H01L 29/423* (2006.01)
*H01L 29/66* (2006.01)
*H01L 29/788* (2006.01)

(52) U.S. Cl.
CPC ........ *H10B 41/10* (2023.02); *H01L 29/40114* (2019.08); *H01L 29/42328* (2013.01); *H01L 29/66825* (2013.01); *H01L 29/7883* (2013.01)

(58) Field of Classification Search
None
See application file for complete search history.

(56) References Cited

U.S. PATENT DOCUMENTS

2015/0087123 A1*   3/2015   Wu .................. H10B 41/50
                                                438/257

FOREIGN PATENT DOCUMENTS

| TW | 522478 B | 3/2003 |
| TW | 200603171 A | 1/2006 |
| TW | 200707652 A | 2/2007 |

OTHER PUBLICATIONS

Taiwan Office Action of Application No. 11221198660 dated Dec. 1, 2023.

* cited by examiner

*Primary Examiner* — Xiaoming Liu
(74) *Attorney, Agent, or Firm* — Lippes Mathias LLP

(57) ABSTRACT

A flash memory includes a linear array of flash memory cells having a source region extending along a first direction. Each flash memory cell includes a floating gate disposed adjacent the source region. The linear array of flash memory cells further includes isolation strips disposed between the floating gates of the flash memory cells. An erase gate line extends along the first direction and is disposed over the source region. A control gate line extends along the first direction and is disposed over the isolation strips and over the floating gates of the flash memory cells. The control gate line has a non-straight edge proximate to the source region that is indented away from the source region at least where the control gate line is disposed over the isolation strips.

20 Claims, 13 Drawing Sheets

FLASH MEMORY LAYOUT TO ELIMINATE FLOATING GATE BRIDGE

BACKGROUND

The following relates to semiconductor fabrication arts, semiconductor memory arts, flash memory arts, split gate flash memory arts, and related arts.

Flash memory is an electronic non-volatile computer memory storage medium that finds application in a wide range of devices and systems, such as solid state drives (SSDs), USB flash drives, memory cards, on-board memory of various types of electronics, embedded memory, and so forth. In general, a flash memory cell has a similar design to a standard MOSFET, but employs a more complex gate structure having a floating gate and a control gate, and includes an additional select or write line. The floating gate is controlled surrounded by insulator material, and electric charge transferred to or from the floating gate alters the threshold voltage of the device, thus enabling storage of a data bit. Split gate flash memory is a type of flash memory in which two sub-cells of a split gate flash memory cell share a common source. These are merely nonlimiting illustrative examples of some flash memory cell designs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
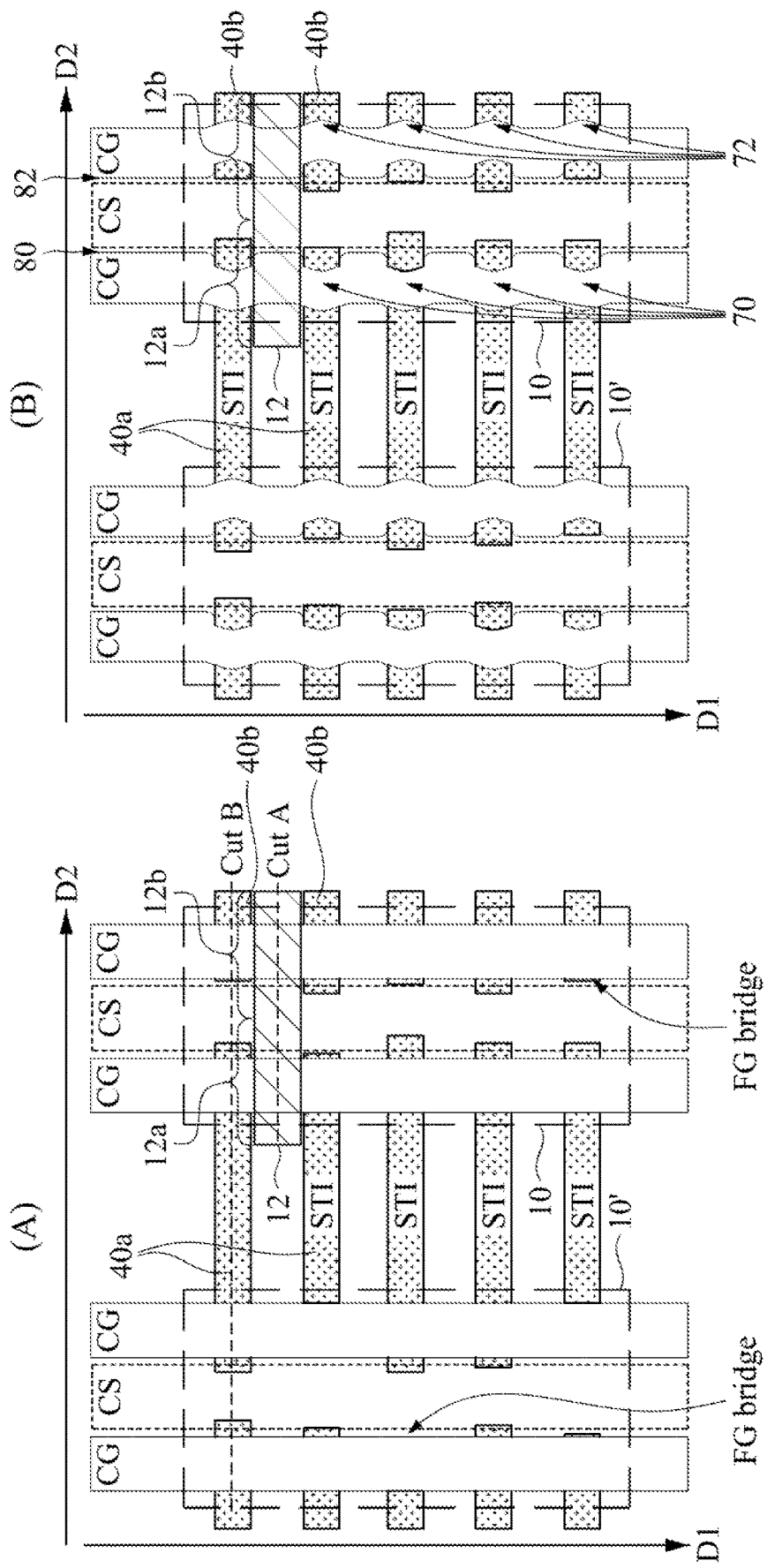
FIG. 1 diagrammatically illustrates (A) a simplified top view of a flash memory with linear control gate lines, and (B) a simplified top view of a flash memory with control gate lines according to a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A failure mode of some flash memory devices is recognized herein and referred to as floating gate bridging. In this failure mode, the floating gates of two (or more) adjacent flash memory cells, which should operate independently, are instead shorted or at least shunted together. A floating gate bridge can lead to functional failure of the flash memory if shipped, or can lead to low device yield if detected during fabrication or quality control testing.

It was determined herein that floating gate bridging can occur when a shallow trench isolation (STI) or other isolation region between two neighboring flash memory cells is of insufficient size, so that floating gate bridging can occur at the "shortened" edge of the STI region. Another determined mechanism is tapered profiling of the gate stack of the flash memory cell, which can occur during photolithographically defined plasma etching of the gate stacks. The tapered gate stack profile can again lead to floating gate bridging across the STI region.

In embodiments disclosed herein, floating gate bridging is reduced or eliminated by a disclosed modification of the control gate line geometry. Particularly, the disclosed embodiments provide a control gate line having a non-straight edge proximate to the common source region that is indented away from the common source region at least where the first control gate line is disposed over the isolation strips. Thus, even if the STI or other isolation strip is too short, the indented control gate line edge ensures some area over which the STI extends beyond that control gate line edge. Advantageously, this improvement is suitably implemented by redesigning the photolithography mask used in the photolithographically patterned etching of the gate stack (sometimes referred to as a "re-tape out" or RTO of the mask design) to provide the appropriate control gate line geometry including the non-straight edge proximate to the common source region that is indented away from the common source region at least where the first control gate line is disposed over the isolation strips. Hence, it does not incur excessive additional cost beyond the RTO process, and does not add any fabrication processing steps.

With reference to FIG. 1(A), a simplified top view of (a portion of) a flash memory is shown. The illustrative flash memory is a split gate flash memory, and the area of an illustrative linear array of split gate flash memory cells is indicated by a dashed box 10, with the area of one split gate flash memory cell 12 indicated by hatching. A common source region CS extends along a first direction D1.

Figure 2:
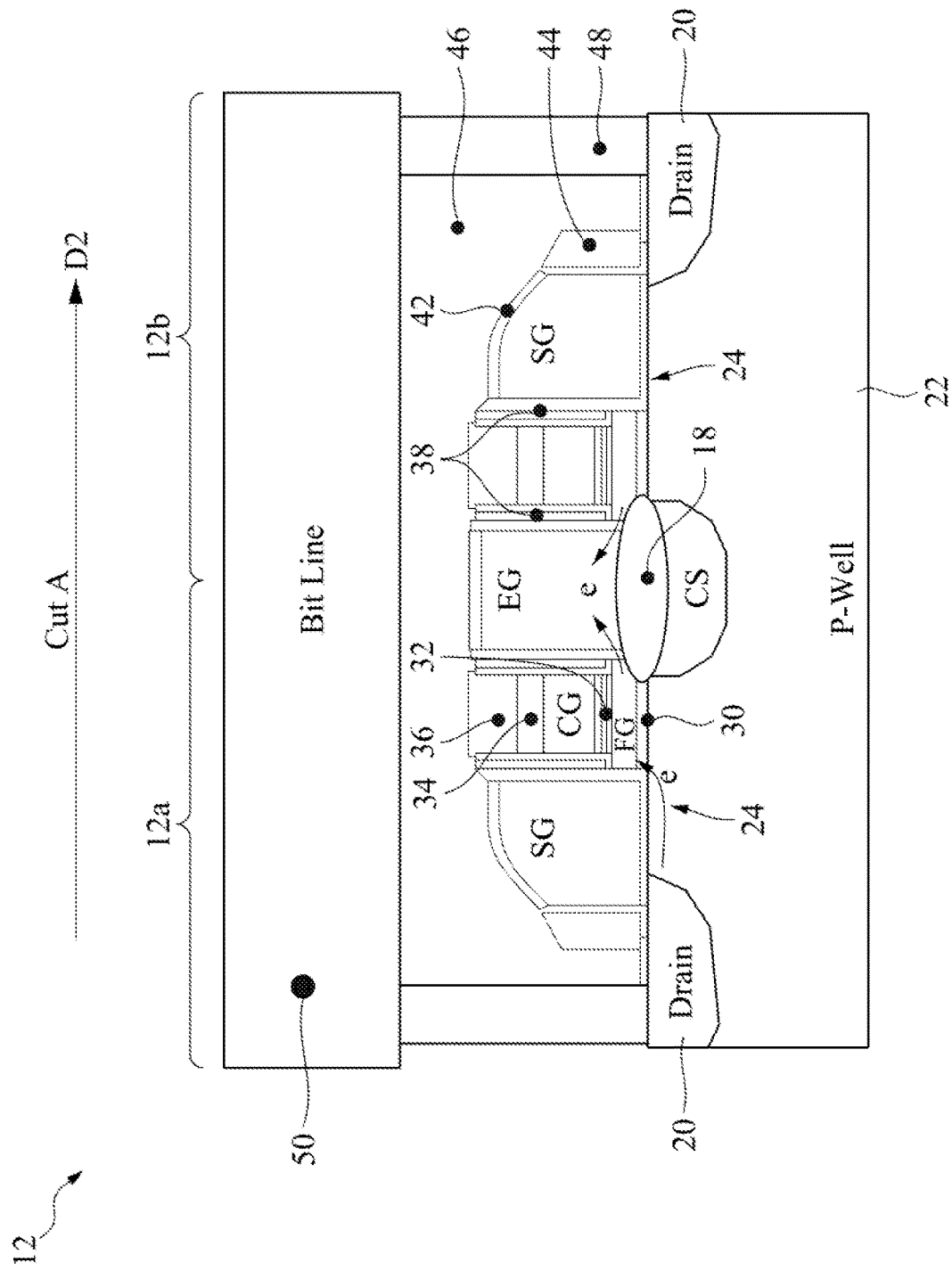
FIG. 2 diagrammatically illustrates Cut A indicated in FIG. 1(A) according to one embodiment.

With further reference to FIG. 2, Cut A indicated in FIG. 1(A) through the illustrative split gate flash memory cell 12 is shown as a cut view in FIG. 2. (As used herein, a cut view refers to a cross-sectional view along a specified cut line, in this case along Cut A). Cut A is along a second direction D2 as indicated in FIG. 1(A) and FIG. 2. The split gate flash memory cell 12 includes two split gate flash memory sub-cell 12a and 12b which share the common source region CS and a common erase gate EG which is spaced apart from the common source region CS by an insulator layer 18, which may by way of nonlimiting illustrative example comprise an oxide such as $SiO_2$ or a silicon oxide of another stoichiometry. As seen in FIG. 1(A), the common source region CS extends along the first direction D1, and as such may alternatively be referred to herein as the common source line CS. The erase gate EG similarly may also referred to herein as an erase gate line EG as it extends along the first direction D1 and is disposed over the common source region CS. (Note that the erase gate line EG is not shown in FIG. 1(A)). Without loss of generality, the split gate flash memory sub-cell 12a is referred to herein as being on a first side of the common source region CS and the split gate flash memory sub-cell 12b is referred to herein as being on a second side of the common source region CS which is opposite the first side. The split gate flash memory sub-cell 12b has a mirror structure to the split gate flash memory sub-cell 12a, with the structure being "mirrored" by a plane passing through the common source region CS. As such, components of the split gate flash memory sub-cells 12a and 12b may be labeled with reference numbers in only one of the sub-cells, but it is to be understood that each component of the split gate flash memory sub-cell 12a has a corresponding component in the split gate flash memory sub-cell 12b (and vice versa), except that the two split gate flash memory sub-cells 12a and 12b share the common source region CS and (common) erase gate EG.

Each split gate flash memory sub-cell 12a and 12b has a structure similar to that of a standard MOSFET, and thus further includes a drain 20, and a gate structure. The latter differs from a standard MOSFET as will be described. In general, the split gate flash memory cell 12 is fabricated on a base material 22, which in the illustrative example is a p-type well (i.e. p-well 22) that may be formed in a silicon layer or substrate by p-type dopant diffusion, p-type dopant implantation, epitaxial growth of the p-type material, or so forth. In the illustrative examples the base material 22 is silicon, although other types of base material are contemplated such as silicon germanium or gallium arsenide. For the illustrative example in which the base material 22 is p-type, the common source region CS and the drains 20 are suitably doped n-type, for example being fabricated in the p-well 22 by n-type dopant diffusion, n-type dopant implantation, or so forth. The illustrative split gate flash memory sub-cell 12a and 12b thus each have a channel 24 extending between the n-type drain 20 and the n-type common source region CS. However, it is contemplated for the split gate flash memory sub-cells to have opposite polarity, i.e. p-type source and drain regions formed in an n-type base material.

The gate structure of the split gate flash memory sub-cells 12a and 12b differ from a standard MOSFET. The gate structure is in the form of a gate stack that includes a floating gate FG spaced apart from the base material 22 by an insulator layer 30, and a control gate CG disposed over the floating gate FG that is spaced apart from the floating gate FG by an insulator 32. In some illustrative embodiments presented herein, the insulator layer 30 interposed between the floating gate FG and the base material 22 is an oxide/nitride/oxide dielectric stack, and the insulator layer 32 interposed between the control gate CG and the floating gate FG is a nitride/oxide/nitride stack, where in each case the oxide is suitably $SiO_2$ or a silicon oxide of another stoichiometry and the nitride is suitably $Si_3N_4$ or a silicon nitride of another stoichiometry. However, these are merely illustrative examples, and the insulator layers 30 and 32 can have other compositions and/or structures, including being contemplated single-material layers.

In FIG. 2, the gate stack further includes an insulator layer 34 disposed on the control gate CG, and a hard mask (HM) layer 36 disposed on the insulator layer 34. These layers may, for example, include a nitride/oxide/nitride stack 34 and a dielectric layer 36 that serves as a mask during photolithographically patterned etching of the gate stack, to be described. In the final fabricated device, the hard mask 36 and insulator layer 34 is partially open to provide electrical access to the gate structure. In a variant embodiment, shown in FIG. 3, the hard mask 36 and insulator layer 34 are completely removed after the photolithographically patterned etching of the gate stack. The gate stack is isolated laterally by an insulator layer 38 formed on the sidewalls of the gate stack. In some illustrative embodiments presented herein the sidewall insulator layer 38 is an oxide/nitride/oxide dielectric stack, although other insulator materials or insulator stacks are contemplated.

With continuing reference to FIG. 2 and with further reference back to FIG. 1(A), each control gate CG extends along the first direction D1, and as such may alternatively be referred to herein as a control gate line CG. There is thus a first control gate line CG on the first side of the common source region CS which belongs to the first split gate flash memory sub-cell 12a, and a second control gate line CG on the second side of the common source region CS which belongs to the second split gate flash memory sub-cell 12b.

On the other hand, the floating gates FG of the linear array of split gate flash memory sub-cells 12 do not extend along the first direction D1 form a continuous line. Rather, as seen in FIG. 1(A), first isolation strips 40a extend along the second direction D2 (which is transverse to the first direction D1) and are disposed between the split gate flash memory cells 12 on the first side of the common source region CS. Put another way, the first isolation strips 40a are disposed between the split gate flash memory sub-cells 12a on the first side of the common source region CS. Put yet another way, first isolation strips 40a are disposed between the floating gates FG on the first side of the common source region CS. Likewise, as also seen in FIG. 1(A), second isolation strips 40b extend along the second direction D2 and are disposed between the split gate flash memory cells 12 on the second side of the common source region CS. Put another way, the second isolation strips 40b are disposed between the split gate flash memory sub-cells 12b on the second side of the common source region CS. Put yet another way, second isolation strips 40b are disposed between the floating gates FG on the second side of the common source region CS. In the illustrative examples, the isolation strips or regions 40a and 40b are shallow trench isolation (STI) regions. However, other types of isolation regions are contemplated, such as local oxidation of silicon (LOCOS) regions.

Note that the above designation of the isolation strips 40a as the "first" isolation strips and isolation strips 40b as the "second" isolation strips is with respect to the representative split gate flash memory cell 12 of the diagrammatically indicated linear array 10 of split gate flash memory cells. In the illustrative example, the isolation strips extend between neighboring arrays 10, 10' along the second direction D2. Hence, for example, the "first" isolation strips 40a in FIG. 1 respective to the array 10 would be "second" isolation strips for the indicated neighboring array 10'.

To summarize the foregoing, the first control gate line CG extends along the first direction D1 on the first side of the common source region CS and is disposed over the first isolation strips 40a and over the first floating gates FG of the split gate flash memory cells 12 (and more particularly of the first split gate flash memory sub-cells 12a). Similarly, the second control gate line CG extends along the first direction D1 on the second side of the common source region CS and is disposed over the second isolation strips 40b and over the second floating gates FG of the split gate flash memory cells 12 (and more particularly of the second split gate flash memory sub-cells 12b).

The split gate flash memory sub-cells 12a and 12b further differ from a standard MOSFET by the inclusion of a select gate SG, which as seen in FIG. 2 is disposed on the channel 24 on the side of the gate stack opposite from the common source region CS. Although not shown in FIG. 1(A), the select gate SG extends along the first direction D1 similarly to the control gate line CG, and as such may alternatively be referred to herein as a select gate line SG. As the select gate line SG may serve to select a bit stored in the split gate flash memory sub-cell for cell operation, the select gate line SG is also sometimes referred to in the art as a write line (WL). FIG. 2 further diagrammatically depicts silicide layers 42 disposed on the select gate SG and erase gate EG, and a nitride spacer 44 on the side of the select gate SG distal from the gate stack.

The above-described components of the split gate flash memory cells 12 are typically formed during front end-of-line (FEOL) processing. The various gates including the erase gate line EG, the floating gates FG, control gate line CG, and select gate line SG formed during FEOL processing are typically formed of polysilicon (sometimes referred to as poly), although other electrically conductive materials are contemplated for forming these gates. Subsequent back end-of-line (BEOL) processing forms one or more metallization layers. FIG. 2 diagrammatically illustrates a first metallization layer including an intermetal dielectric (IMD) material 46 such as $SiO_2$ or a silicon oxide of another stoichiometry, $Si_3N_4$ or a silicon nitride of another stoichiometry, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. The IMD 46 is patterned to form electrical vias of a metal or other electrically conductive material contacting the split gate flash memory cell 12, such as an illustrative electrical via 48 connecting the drain 20 to a bit line 50 of the flash memory.

Figure 3:
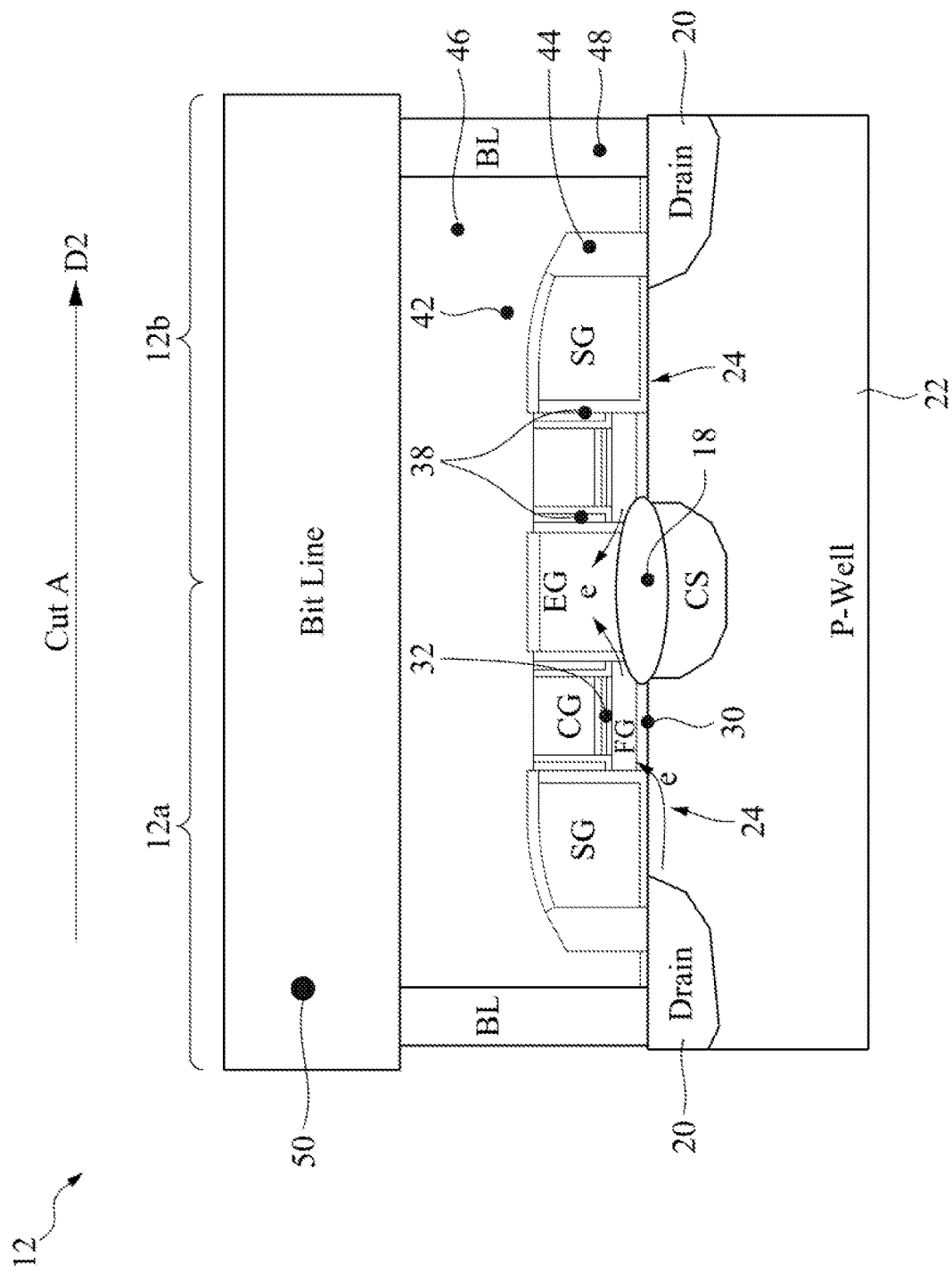
FIG. 3 diagrammatically illustrates Cut A indicated in FIG. 1(A) according to another embodiment.

As previously noted, FIG. 3 depicts a variant embodiment of a split gate flash memory cells 12 which is similar to that of FIG. 2, except that in the variant embodiment of FIG. 3 the hard mask 36 and insulator layer 34 of FIG. 2 are completely removed after the photolithographically patterned etching of the gate stack.

It is to be appreciated that FIGS. 2 and 3 each depict a cross-sectional view of a single split gate flash memory cell 12 (which includes two split gate flash memory sub-cells 12a and 12b), and FIG. 1(A) depicts a linear array 10 of split gate flash memory cells 12 including the common source line CS extending along a first direction D1, along with depiction of the two control gate lines CG. The linear array 10 of split gate flash memory cells 12 is typically one sub-unit of a large flash memory, with arrays and individual cells addressable using the various gate lines such as the illustrative erase gate line EG, control gate lines CG, select gate lines SG, and bit lines 50. The addressing and the detailed operation depends on the type and architecture of the specific flash memory under consideration. For example, a flash memory with a NAND topology may be divided into addressable blocks and pages. In general, nonvolatile storage is achieved by storing charge in the floating gates FG of the memory cells. The charge in the floating gate FG operates to screen the electric field from the control gate CG, thus changing the threshold voltage of the cell. In the illustrative example of FIG. 2, electrons enter the floating gate FG from the channel 24 by passing through the insulator layer 30 interposed between the floating gate FG and the base material 22, for example by Fowler-Nordheim tunneling in some embodiments. The select gate SG (also called the write gate) selects the bit for cell operation. The erase gate EG is used to "erase" the electron from the floating gate FG by transfer of the electron to the erase gate EG.

Figure 4:
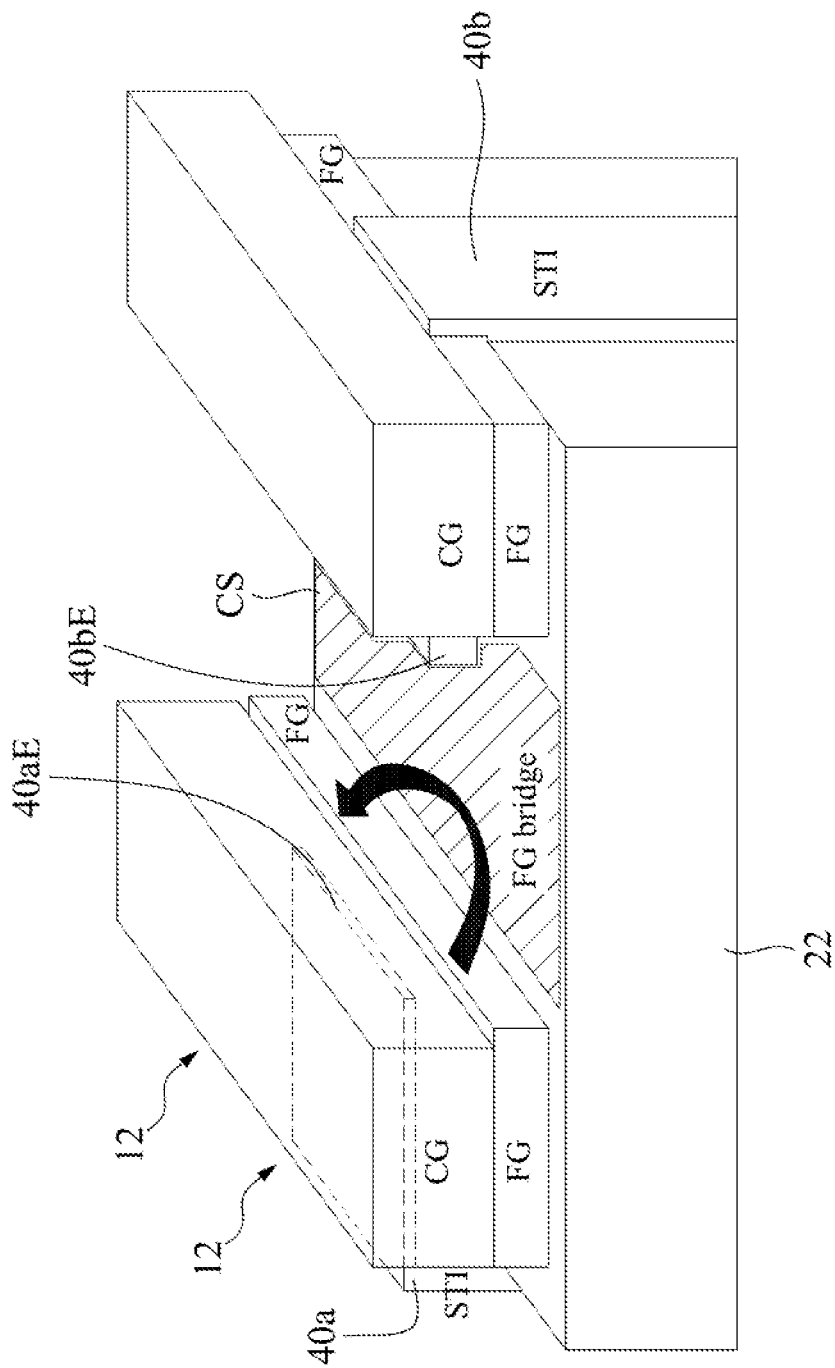
FIG. 4 diagrammatically illustrates a simplified perspective view of a portion of a flash memory that includes a floating gate bridge.

With reference back to FIG. 1(A) and with further reference to FIG. 4, one possible genesis of the failure mode of floating gate bridging is described. In a floating gate bridge, the floating gates FG of two (or more) adjacent flash memory cells 12 are shorted or at least shunted together. It was determined herein that floating gate bridging can occur when the isolation strips or regions 40a, 40b between two neighboring flash memory cells 12 is of insufficient size in that it does not extend far enough toward or into the common source region CS, so that floating gate bridging can occur at the "shortened" edge of the isolation strip. FIG. 1(A) depicts several such FG bridges. FIG. 4 diagrammatically illustrates a simplified perspective view of a portion of a flash memory showing two neighboring split gate flash memory cells 12, the base material (i.e. p-well) 22, the common source region CS, isolation strips 40a and 40b located between the two cells 12 on opposite sides of the common source region CS, the floating gates FG of the two cells 12, and the control gate lines CG on the opposite sides of the common source region CS. The split gate flash memory sub-cells on the right-hand side in the view of FIG. 4 are separated by the isolation strip 40b. As seen in FIG. 4, the end 40bE of the isolation strip 40b proximate to (or in) the common source region CS extends far enough toward or into the common source region CS so that it fully separates the floating gates FG of the righthand sub-cells. This is the desired configuration, as it enables the two floating gates FG to store and release electrons independently of each other.

However, as further seen in FIG. 4, the split gate flash memory sub-cells on the lefthand side in the view of FIG. 4 are not fully separated by the isolation strip 40a. As seen in FIG. 4, the end 40aE of the isolation strip 40a does not extend far enough toward or into the common source region CS to completely separate the floating gates FG of the lefthand sub-cells. This creates the indicated floating gate bridge (denoted as "FG bridge" in FIG. 4). This is undesired, as the floating gate bridge shorts (or at least shunts) the two floating gates FG of the lefthand sub-cells so that they are no longer electrically independent. For example, electrons transferred into the floating gate FG of one lefthand sub-cell can transfer via the floating gate bridge to the floating gate FG of the other, neighboring lefthand sub-cell.

Figure 5:
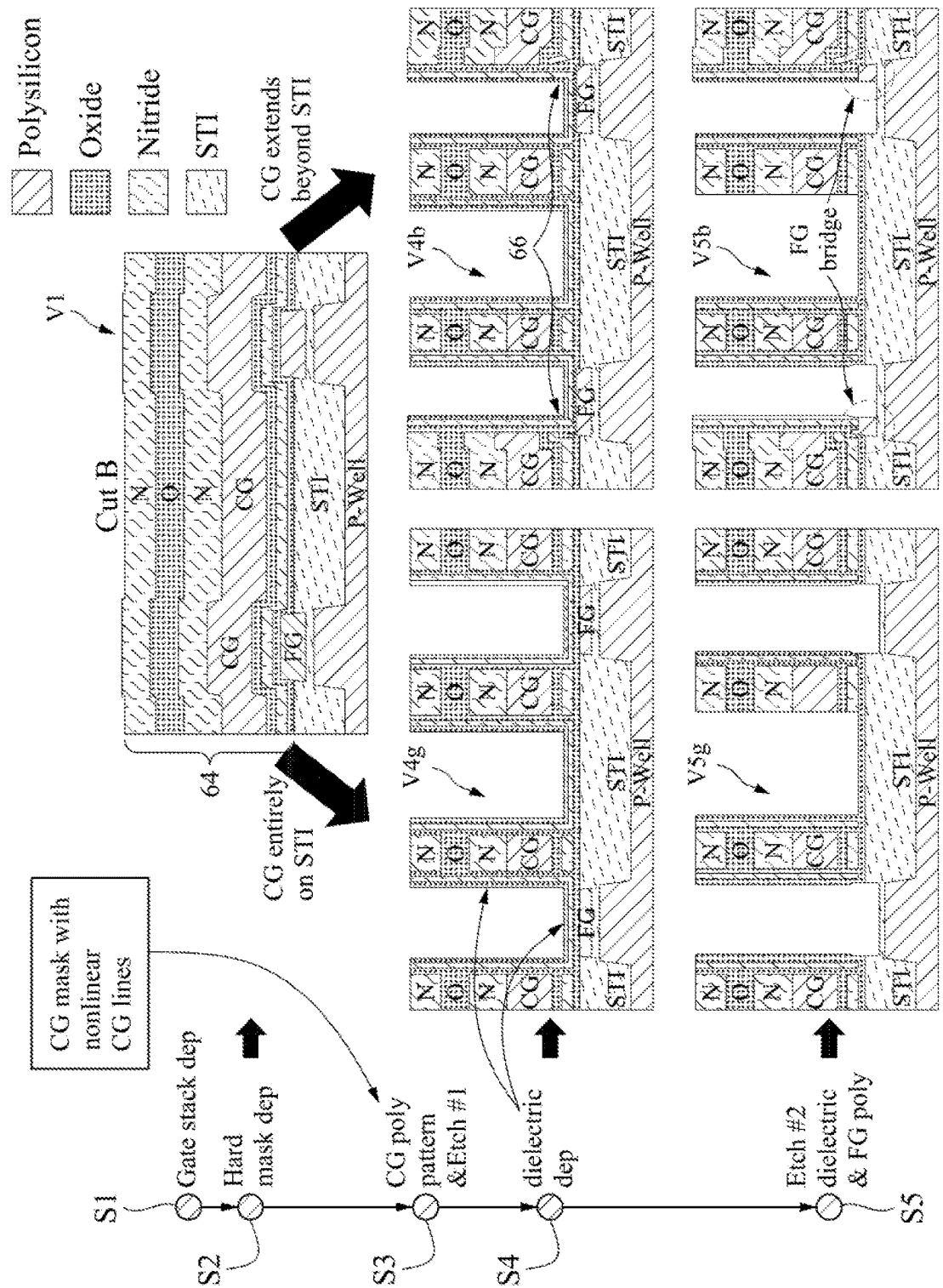
FIG. 5 diagrammatically illustrates fabrication of a flash memory using the view of Cut B of FIG. 1(A).
Figure 6:
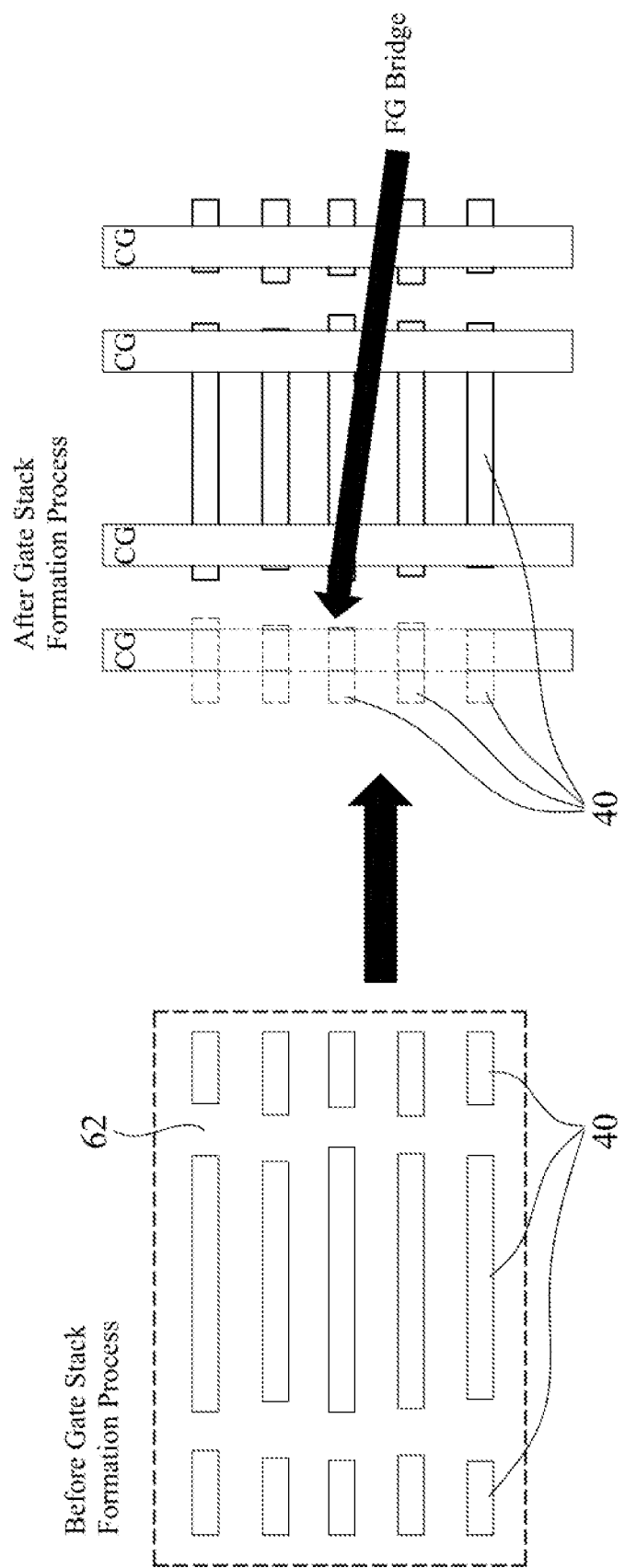
FIG. 6 diagrammatically illustrates top views before and after the gate stack formation process of FIG. 5 by way of top views.

With reference to FIGS. 5 and 6, formation of a floating gate bridge is further described in relationship to the processing sequence for forming the gate stack. At the left side of FIG. 5, a gate stack formation process 60 is diagrammatically illustrated. This process 60 is performed on a starting surface depicted in the lefthand top view of FIG. 6. The starting surface includes the isolation strips 40 which have been previously formed in the base material, and a floating gate layer 62 which has been previously deposited on the base material, and which does not cover the isolation strips 40. (Note that in FIG. 6 the first and second isolation strips 40a and 40b of FIG. 1(A) and FIG. 4 are generically labeled as isolation strips 40 for simplicity in FIG. 6). Portions of the floating gate layer 62 will be removed by photolithographically patterned etching during the gate stack formation process 60 to form the floating gates FG. FIG. 5 also shows a cross-sectional views taken along Cut B indicated in FIG. 1(A) at various points during the gate stack formation process 60. As seen in FIG. 1(A), Cut B passes through two neighboring linear arrays 10 of split gate flash memory cells 12, and is aligned with the isolation strips 40a, 40b separating two neighboring split gate flash memory cells 12. It is also noted that FIG. 6 does not depict the common source region CS which was formed prior to deposition of the floating gate layer 62.

The gate stack formation process 60 begins with a step S1 in which gate stack layers 64 (not including the floating gate layer 62 which was previously formed) are deposited as blanket layers. The deposited gate stack layers include: an insulating (sub-) stack of oxide/nitride/oxide disposed on the floating gate layer 62 and on the isolation regions (STI) 40 (this will form the insulating layer 32 of FIG. 2 after the patterned etching); a polysilicon layer that will form the control gate line CG after patterned etching; and an insulating (sub-)stack of nitride/oxide/nitride that will form the insulating layer 32 of FIG. 2 after the patterned etching.

In a step S2, a hard mask is deposited on top of the gate stack layers 64. The hard mask is not shown in FIG. 5, but corresponds to the hard mask 36 shown in FIG. 2. In a step S3, the hard mask and underlying gate stack layers 64 undergo photolithographically patterned etching. This process entails depositing photoresist on the hard mask, exposing the photoresist through a gate stack mask followed by photoresist development to remove the photoresist except where the gate stacks are to be retained, and then performing Etch #1 indicated in the depicted process 60. Etch #1 may comprise plasma etching using an etch gas or gases such as $Cl_2$, $CF_4$, HBr, or so forth. Etch #1 etches the thick hard mask film and the polysilicon of the control gate layer, leaving the oxide/nitride/oxide insulator layer that underlies the control gate layer. In a subsequent step S4, a dielectric layer is deposited to form the insulator layer 38 formed on the sidewalls of the gate stack. (See FIG. 2).

With continuing reference to FIG. 5, after the step S4 the gate stacks are defined, except that the floating gate layer 62 and its overlying oxide/nitride/oxide layer have not yet been removed. Two cross-sectional views V4g and V4b depict possible configurations after the step S4. The view V4g shows a "good" view, in which the isolation strips (corresponding to the STI regions of FIG. 5) are of sufficient area so that they can prevent floating gate bridging. By contrast, the view V4b shows a "bad" view, in which the isolation strips in two depicted places 66 are not of sufficient area to prevent floating gate bridging.

In a final step S5 of the process 60, a second Etch #2 is performed to remove the floating gate layer 62 and its overlying oxide/nitride/oxide insulator layer except in the areas underneath the gate stack. Etch #2 can again employ plasma etching, using an etch gas or gases such as $CF_4$ and/or HBr. Two cross-sectional views V5g and V5b depict possible configurations after the step S5. The view V5g shows a "good" view, in which the isolation strips (corresponding to the STI regions of FIG. 5) are of sufficient area so that they have successfully prevented floating gate bridging. By contrast, the view V5b shows a "bad" view, in which the isolation strips in the two depicted places 66 were not of sufficient area to prevent floating gate bridging, and hence floating gate (FG) bridging occurred in these areas. With reference also back to FIG. 6, the righthand diagram shows another example of a floating gate bridge formed at one place where the isolation strip 40 was insufficient to prevent the floating gate bridge formation.

Figure 7:
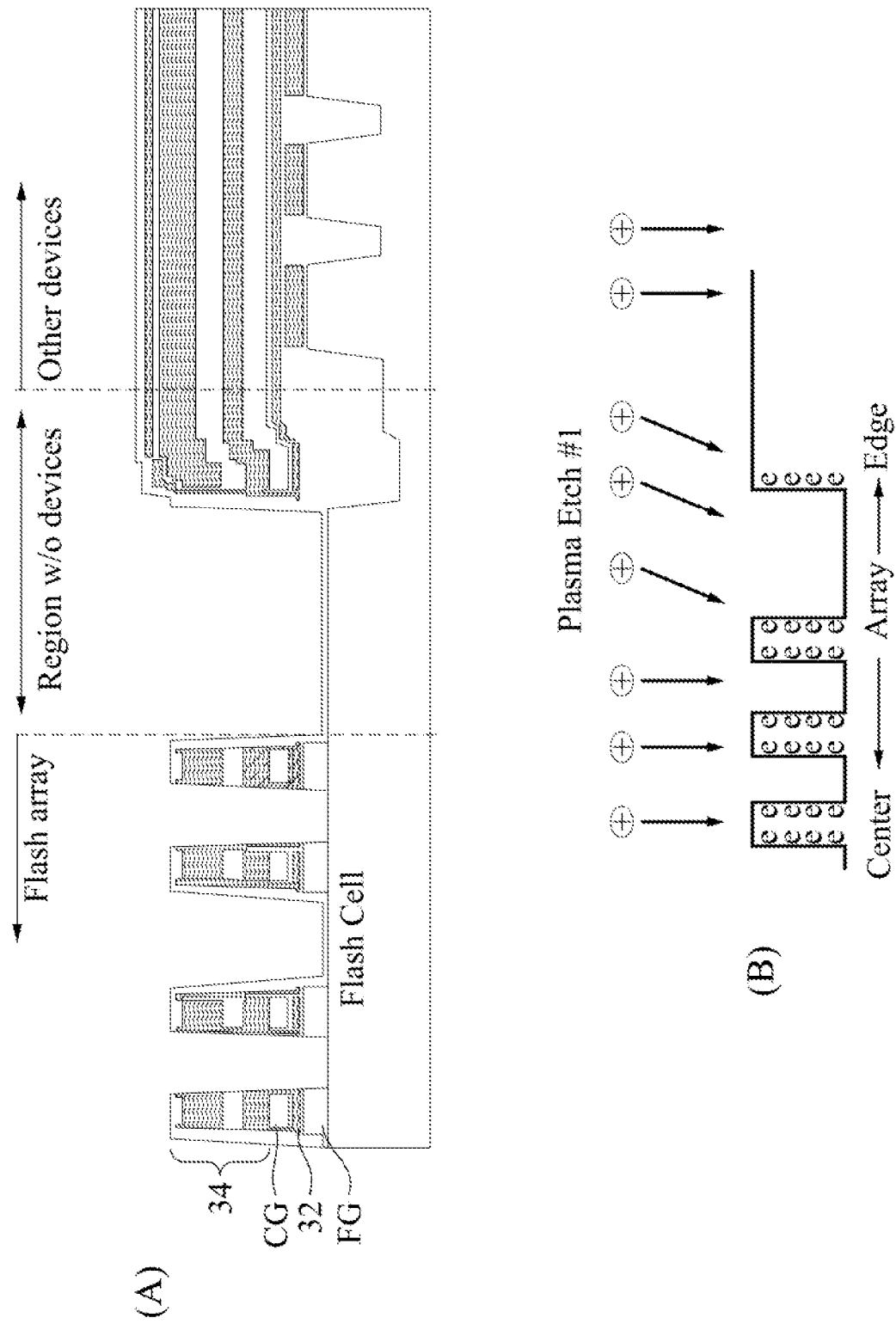
FIG. 7 diagrammatically illustrates (A) a side sectional view of a flash memory array and a region of other devices, separated by a region without devices, and (B) a diagrammatic representation of formation of a tapered profile of a control gate stack during a plasma etching step of the flash memory fabrication process.

With reference now to FIGS. 7(A) and 7(B), another possible mechanism for formation of a floating gate bridge is a tapered profile of the gate stack produced during Etch #1 of step S3 of the gate stack formation process 60 of FIG. 5. As shown in the side sectional view of FIG. 7(A), a flash array comprises a large two-dimensional array of linear arrays 10, 10' shown in FIG. 1A. The density of gate stacks is thus high in the flash array area. Outside of the flash array area there will usually be a region which is free of devices of any kind (or, at most, may have a low density of such devices). If the flash array is being integrated with other components of an overall IC (for example, the flash array being the memory of a system-on-chip, SOC) then there may be regions of "Other devices" as further diagrammatically depicted in FIG. 7(A). This configuration creates a nonuniform three-dimensional surface with a high density of relatively high-profile features (i.e. gate stacks) in the flash array region surrounded by a region with no devices, and possibly other areas of high-profile features (e.g., the "Other devices"). As seen in FIG. 7(B), during plasma etching this can create various laterally nonuniform electrical charging effects. Particularly, the static charge that builds up on the sidewalls of the gate stacks can vary across the flash array. This variable static charge, in turn, can locally modify the etch rate achieved by Etch #1, which in turn can lead to tapering of the gate stacks, with the amount of tapering being different in different areas of the flash array. Hence, while the isolation strips 40 may be of sufficient size to ensure isolation of neighboring floating gates FG when the gate stack is narrow (i.e. having nearly vertical sidewalls), the problem of floating gate bridging can still arise as the isolation strips may be insufficient to prevent floating gate bridging in areas where Etch #1 produces tapered gate stacks (i.e., gate stacks whose sidewalls are slanted). This spatial nonuniformity issue is enhanced for large-area flash memory arrays.

With reference now to FIG. 1(B), a first embodiment which suppresses or eliminates floating gate bridging is described. The embodiment of FIG. 1(B) includes the same features as the embodiment of FIG. 1(A), and are labeled accordingly. However, the embodiment of FIG. 1(B) differs from that of FIG. 1(A) in that the control gate lines CG are not straight, but rather include bent portions that bend away from the common source region CS where the control gate line CG crosses the isolation strips 40a and 40b.

More particularly, the first control gate line CG extending along the first direction D1 on the first side of the common source region CG and disposed over the first isolation strips 40a includes bent portions 70 that bend away from the common source region CS where the first control gate line CG crosses the first isolation strips 40a. In like fashion, the second control gate line CG extending along the first direction D1 on the second side of the common source region CG and disposed over the second isolation strips 40b includes bent portions 72 that bend away from the common source region CS where the second control gate line CG crosses the second isolation strips 40b.

Figure 8:
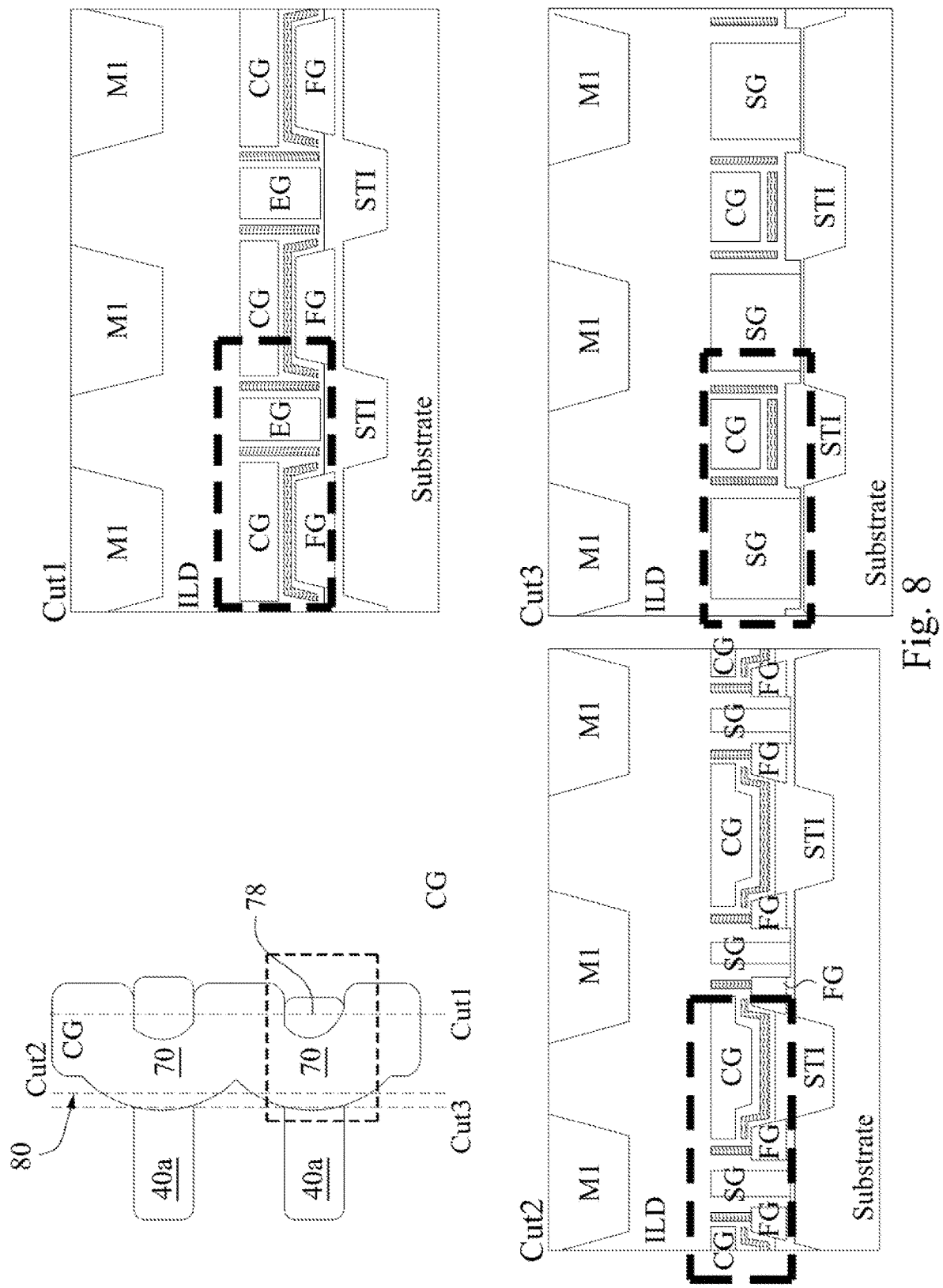
FIG. 8 diagrammatically illustrates an enlarged portion of the simplified top view of the flash memory with control gate lines shown in FIG. 1(B), along with cut views of Cut 1, Cut 2, and Cut 3 indicated in the enlarged portion.

With reference to FIG. 8, in the upper left an enlarged top view is shown of a portion of the first control gate line CG of the embodiment of FIG. 1(B) extending across two of the first isolation strips 40a. FIG. 8 also depicts three cross-sectional views of the portion of the first control gate line CG corresponding to Cut 1, Cut 2, and Cut 3 indicated in FIG. 8. (Note that in these and some other cut views presented herein, the "ILD" is interlayer dielectric and "M1" represents metal traces of the first metallization layer, these components being formed during BEOL processing.) As seen in the top view, the lower first isolation strip 40a is too short to reach the rightmost edge 80 of the control gate line CG. In the embodiment of FIG. 1(A) this would result in the control gate line overextending the end of the lower isolation strip, potentially leading to a floating gate bridge as illustrated for example in FIG. 4 (where, as previously described the end 40aE of the isolation strip 40a proximate to the common source region CS does not extend far enough toward or into the common source region CS to completely separate the floating gates FG of the lefthand sub-cells). By contrast, as seen in the top view of the upper left of FIG. 8 this situation is prevented because the bent portion 70 disposed over the first isolation region 40a means that the first control gate line CG has a non-straight edge 76 proximate to the common source region CS (see also FIG. 1B) that is indented away from the common source region CS where the first control gate line CG is disposed over the first isolation strip 40a. This indentation away from the common source region CS ensures that there is an area 78 where the end of the isolation strip 40a extends beyond the control gate line CG, thus preventing floating gate bridging across the isolation strip 40a. This effect is also seen in the Cut 1 cross-sectional view, where the STI (corresponding to first isolation strip 40a) is not covered by the control gate line CG in Cut 1. This also means that during Etch #2 of the gate stack formation process 60 of FIG. 5 the underlying floating gate layer 62 (see FIG. 6) is etched away, and this removal of the floating gate layer atop the area 78 is what ensures no floating gate bridge is formed.

The modification of the embodiment of FIG. 1(A) to obtain FIG. 1(B) is achievable without additional processing. It is sufficient to use a modified photolithography mask in step S3 of the gate stack formation process 60 of FIG. 5. That is, a "re-tape out" or RTO of the mask design is performed, which replaces the straight portions of the mask corresponding to the straight control gate lines CG of FIG. 1(A) with modified portions delineating the control gate lines CG of the embodiment of FIG. 1(B) with the bent portions 70 and 72. Hence, there is no additional processing required beyond the RTO process, and the disclosed floating gate bridging suppression is obtained without additional cost or processing time.

With reference back to FIG. 1(B), more generally the disclosed floating gate bridging suppression can be obtained by other RTO designs which provide control gate layouts in which: (i) the first control gate line CG extending along the first direction D1 on the first side of the common source region CS and disposed over the first isolation strips 40a and over the first floating gates of the split gate flash memory cells has a non-straight edge 80 proximate to the common source region CS that is indented away from the common source region CS at least where the first control gate line CG is disposed over the first isolation strips 40a; and (ii) the second control gate line CG extending along the first direction D1 on the second side of the common source region CS and disposed over the second isolation strips 40b and over the second floating gates of the split gate flash memory cells has a non-straight edge 82 proximate to the common source region CS that is indented away from the common source region CS at least where the second control gate line CG is disposed over the second isolation strips 40b. With reference to FIGS. 9-12, some other embodiments implementing this floating gate bridging suppression mechanism are described.

Figure 9:
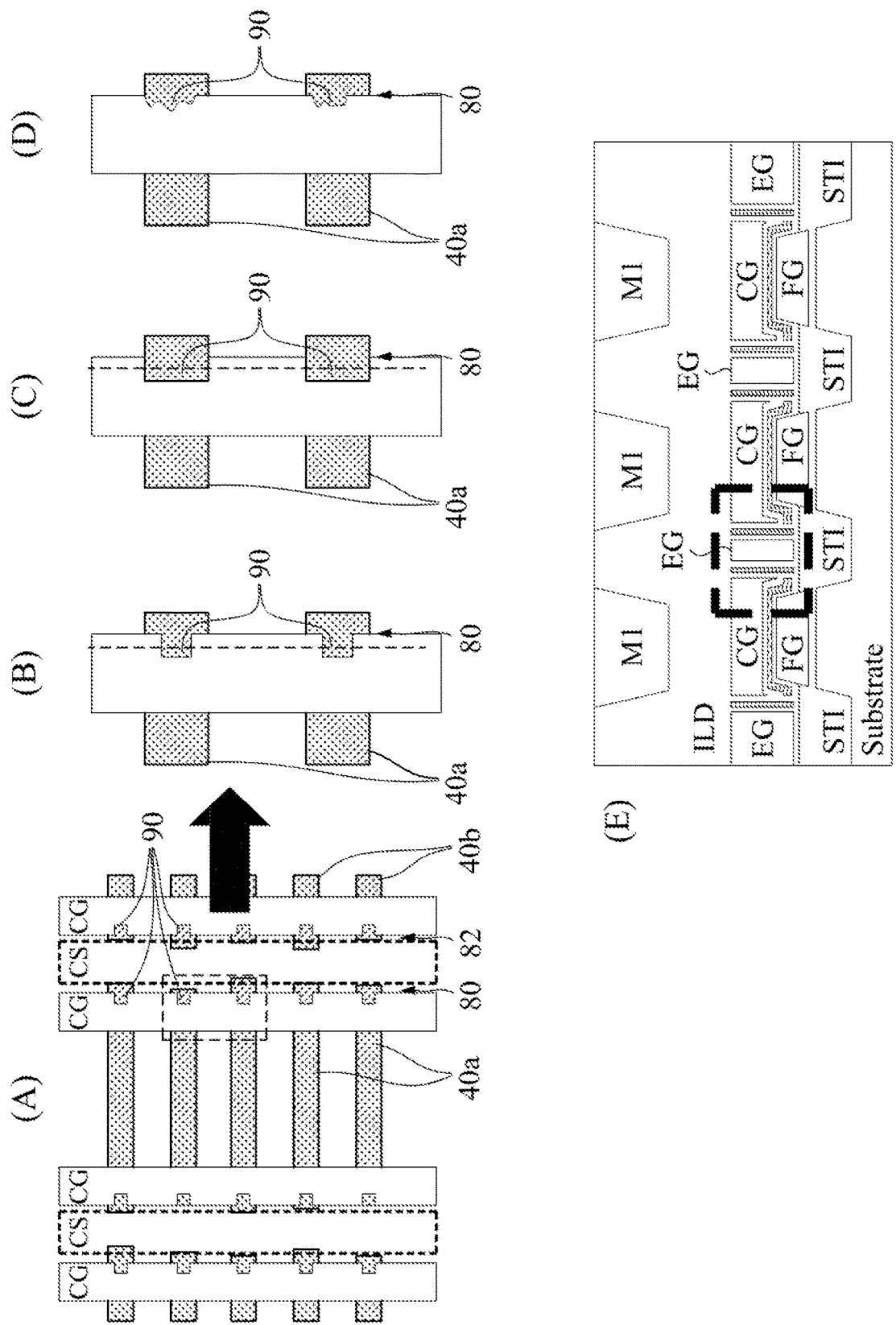
FIG. 9 diagrammatically illustrates (A) a simplified top view of a flash memory with control gate lines according to a second embodiment, (B) and (C) and (D) show three variants of the embodiment of FIGS. 9(A), and (E) shows a cut view indicated in FIG. 9(B).

With reference to FIG. 9, a second embodiment which suppresses or eliminates floating gate bridging is described. As seen in the top view of FIG. 9(A), the non-straight edges 80 and 82 of the respective first and second control gate lines CS that are proximate to the common source region CS have notches 90 where the respective first and second control gate lines CS crosses the respective first and second isolation strips 40a and 40b. FIG. 9(B) illustrates an enlarged top view of two of the notches 90 in the first control gate line CS. FIG. 9(C) illustrates a variant embodiment in which the notches 90 are wider. In the specific embodiment of FIG. 9(C) the notch width is equal to the width of the isolation strips 40a. However, the notches could even be wider than the width of the isolation strips. While the embodiments of FIGS. 9(A)-9(C) employ rectangular notches 90, a variant embodiment shown in FIG. 9(D) illustrates notches 90 of nonrectangular shape. FIG. 9(D) depicts a cross-sectional view taken along the cut line indicated in FIG. 9(B). A cross-sectional view taken along the cut line indicated in FIG. 9(C) would be similar to that of FIG. 9(E). The notches 90 thus directly provide the desired indentations away from the common source region CS at least where the control gate line CG is disposed over the isolation strips.

Figure 10:
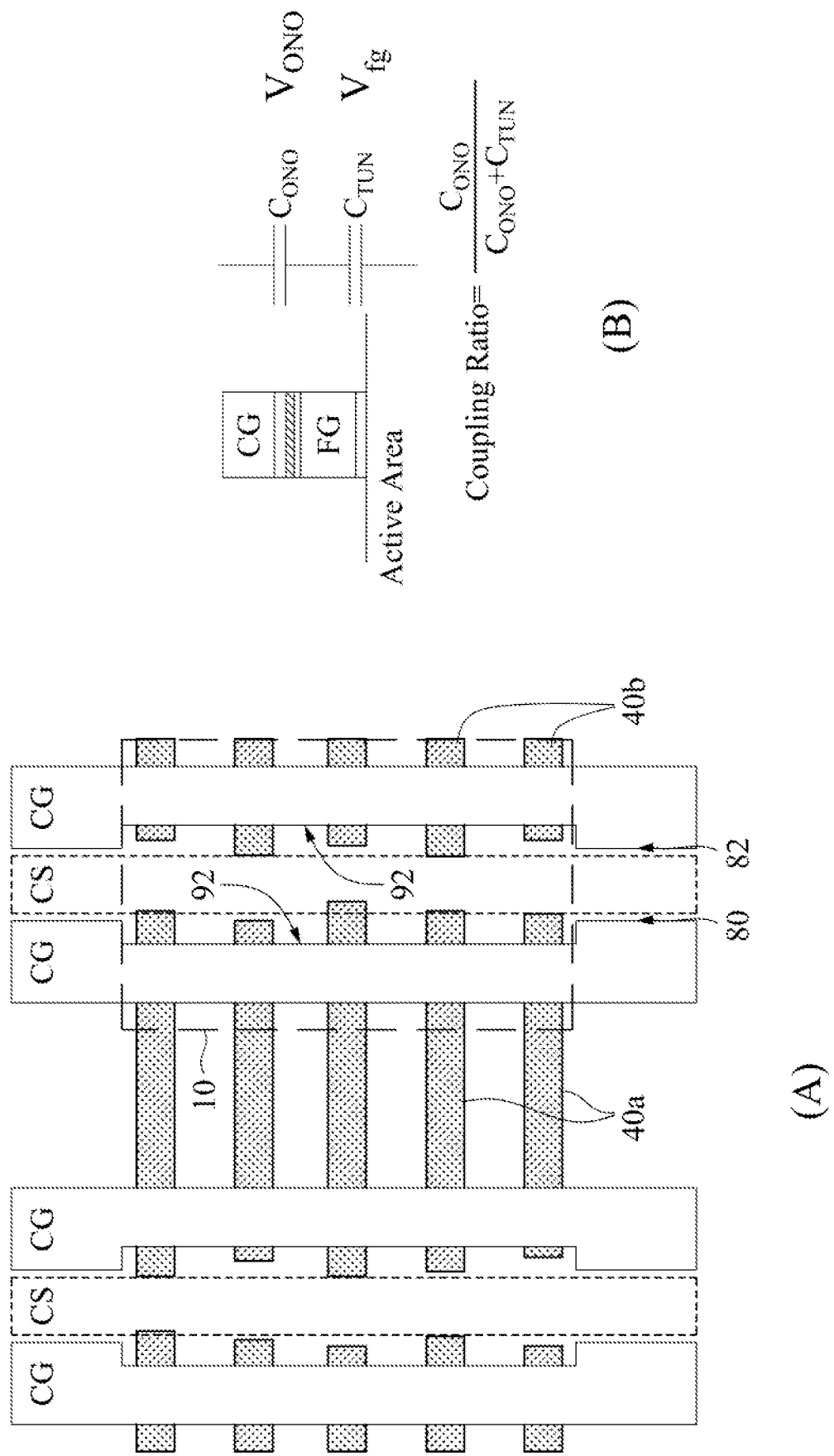
FIG. 10 diagrammatically illustrates (A) a simplified top view of a flash memory with control gate lines according to a third embodiment, and (B) a diagrammatic representation of definition of a coupling ratio indicative of coupling between the control gate and the floating gate.

With reference to FIG. 10, a third embodiment which suppresses or eliminates floating gate bridging is described.

As seen in the top view of FIG. 10(A), the non-straight edges 80 and 82 of the respective first and second control gate lines CS that are proximate to the common source region CS have notches 92 where the respective first and second control gate lines CS cross the linear array 10 of flash memory cells. This embodiment is similar to the second embodiment of FIG. 9, but here the notches 92 extend over the floating gates. This does not impact the effectiveness of the indentations provided by the notches 92 in preventing floating gate bridging. However, the extension of the notches 92 over the floating gates does reduce the coupling ratio between the control gate CG and the floating gate FG. FIG. 10(B) presents a diagrammatic representation of a definition of a coupling ratio indicative of coupling between the control gate CG and the floating gate FG, given by:

$$CouplingRatio = \frac{C_{ONO}}{C_{ONO} + C_{TUN}} \quad (1)$$

where, as indicated in FIG. 10(B), $C_{TUN}$ is the capacitance of the insulator layer 30 interposed between the floating gate FG and the base material 22 (see FIG. 2) and $C_{ONO}$ is the capacitance of the insulator layer 32 interposed between the control gate CG and the floating gate FG (see FIG. 2). It will be appreciated that in the design of FIG. 10(A), the reduction of the width of the control gate line CG at the notch 92 reduces the capacitance $C_{ONO}$ and thus reduces the coupling ratio in accord with Equation (1) above.

Figure 11:
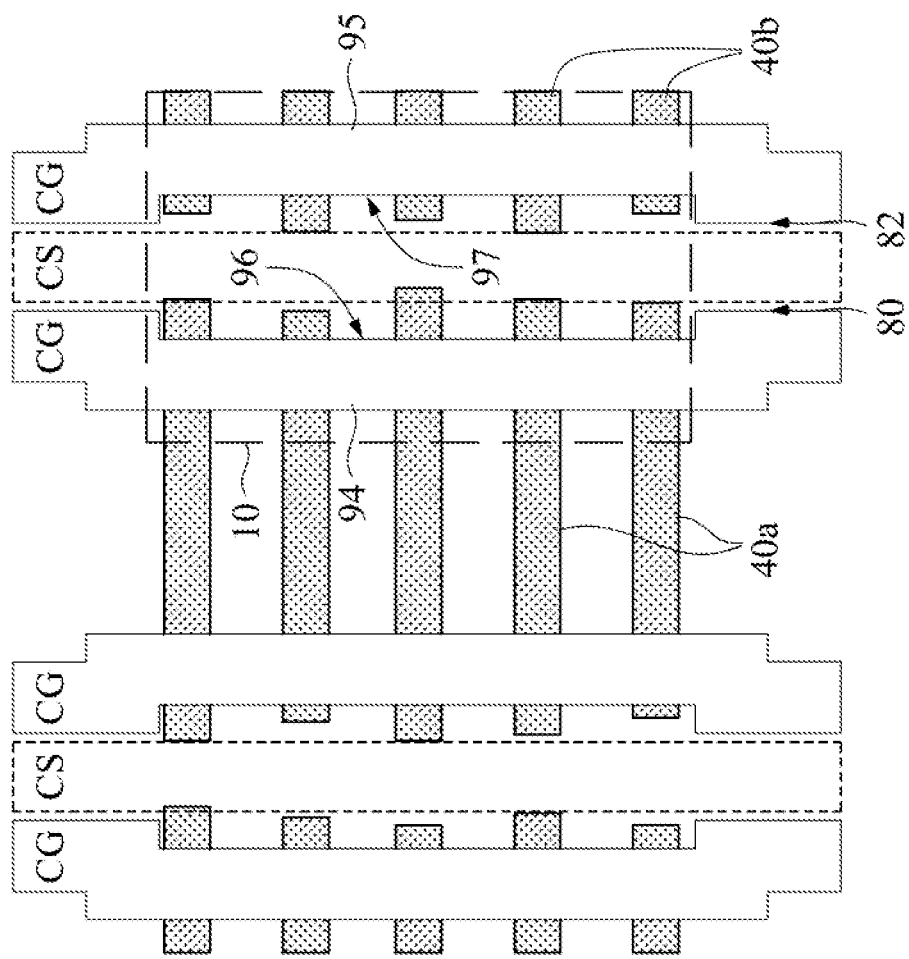
FIG. 11 diagrammatically illustrates a simplified top view of a flash memory with control gate lines according to a fourth embodiment.

With reference to FIG. 11, a fourth embodiment which suppresses or eliminates floating gate bridging is described. As seen in the top view of FIG. 11, the first control gate line CG which crosses the first isolation strips 40a includes an offset portion 94 that is offset away from the common source region CS where the first control gate line CS crosses the linear array 10 of flash memory cells; and likewise the second control gate line CG which crosses the first isolation strips 40b includes an offset portion 95 that is offset away from the common source region CS where the second control gate line CG crosses the linear array 10 of flash memory cells. The offset portion 94 creates an indentation 96 in the non-straight edge 80 of the first control gate line CG proximate to the common source region CS that is indented away from the common source region CS; and likewise the offset portion 95 creates an indentation 97 in the non-straight edge 82 of the second control gate line CG proximate to the common source region CS that is indented away from the common source region CS.

Figure 12:
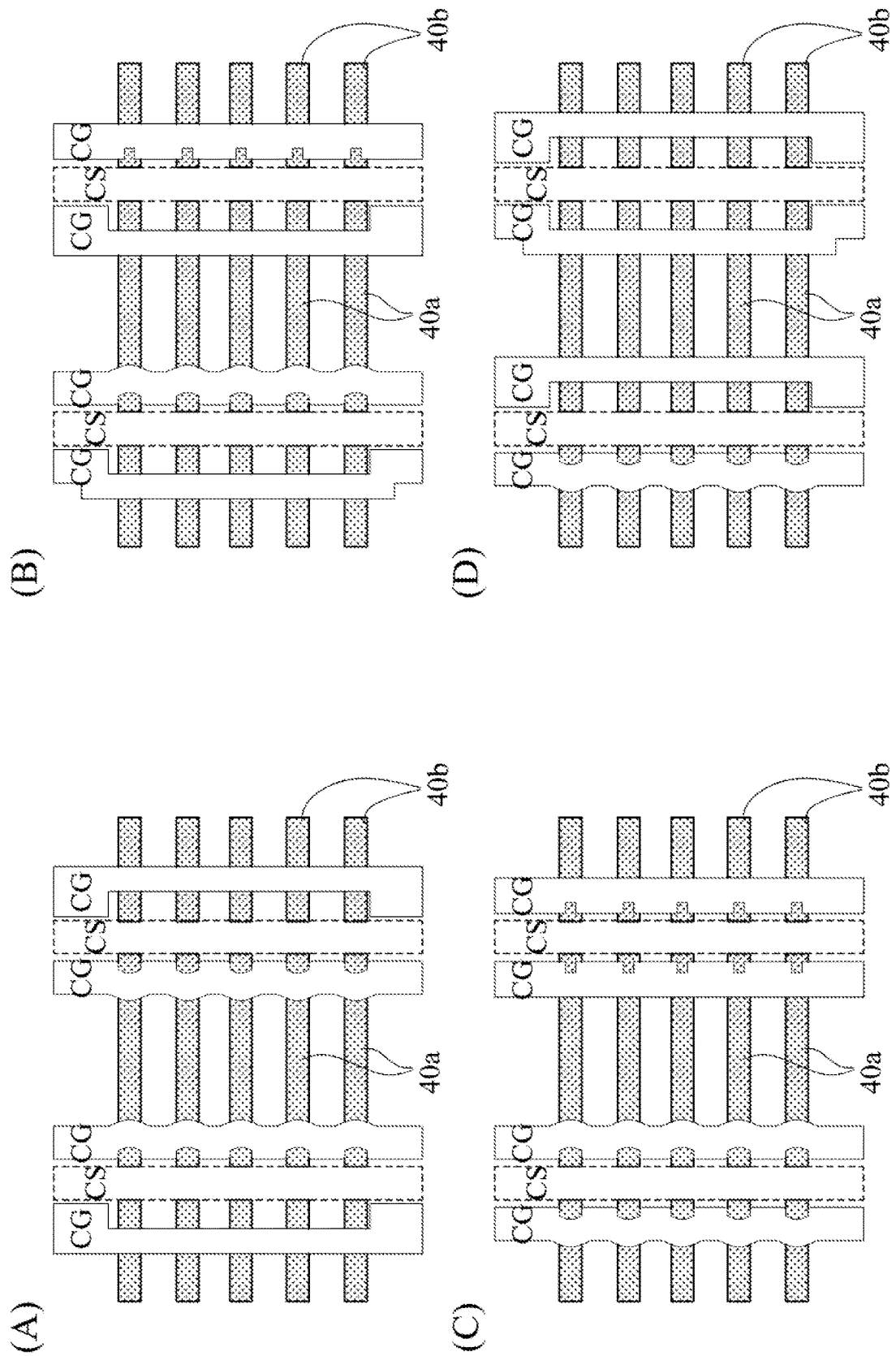
FIG. 12 diagrammatically illustrates simplified top views of flash memory embodiments with control gate lines which (A) combine the first and third embodiments of respective FIGS. 1 and 10; (B) combine the first, second, third, and fourth embodiments of respective FIGS. 1, 9, 10, 11, and (C) combine the first and second embodiments of respective FIGS. 1 and 9, and (D) combine the first, third and fourth embodiments of respective FIGS. 1, 10, and 11.

With reference to FIG. 12, it will be appreciated that various combinations of the first, second, third, and fourth embodiments of respective FIGS. 1(B), 9, 10, and 11 are possible. FIG. 12(A) illustrates a top view of an embodiment that combines the first and third embodiments of respective FIGS. 1 and 10. FIG. 12(B) illustrates a top view of an embodiment that combines the first, second, third, and fourth embodiments of respective FIGS. 1, 9, 10, 11. FIG. 12(C) illustrates a top view of an embodiment that combines the first and second embodiments of respective FIGS. 1 and 9. FIG. 12(D) illustrates a top view of an embodiment that combines the first, third and fourth embodiments of respective FIGS. 1, 10, and 11. It will be further appreciated that these are merely illustrative examples, and that other combinations are contemplated.

Generalizing from the various foregoing nonlimiting illustrative embodiments, the disclosed floating gate bridging suppression is obtained by introducing indentations in the non-straight edges 80 and 82 of the respective control lines CG proximate to the common source region CS that ensure the respective isolation regions 40a and 40b extend beyond those proximate edges 80 and 82. The amount of indentation should be sufficient to ensure this floating gate bridge-suppressing extension of the isolation region. To quantify the indentation, an offset ratio can be defined, as explained below, which is expected to ensure the amount of indentation is sufficient to ensure floating gate bridge suppression while limiting undesirable reduction in the coupling ratio between the control gate and floating gate.

Figure 14:
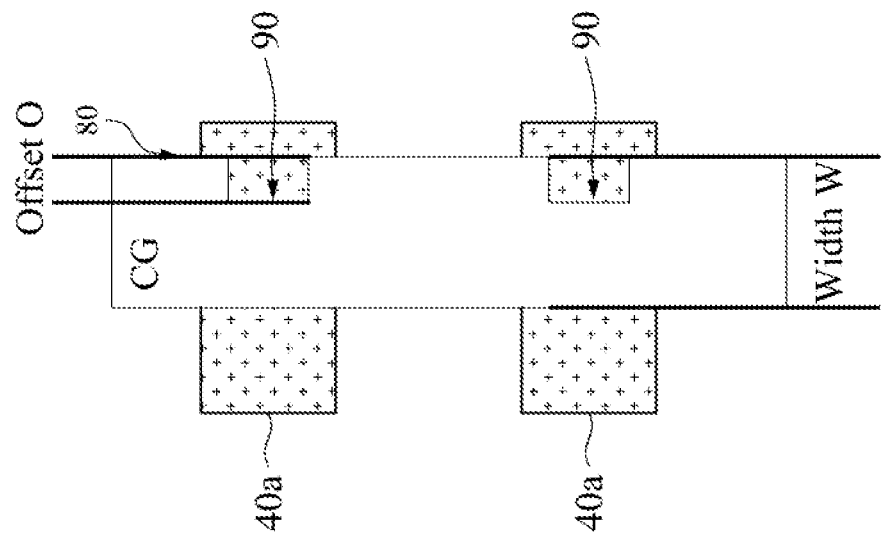
FIG. 14 shows a top view of an enlarged portion of the simplified top view of the flash memory with control gate lines shown in FIG. 9 with dimensions for defining an indentation fraction.
Figure 13:
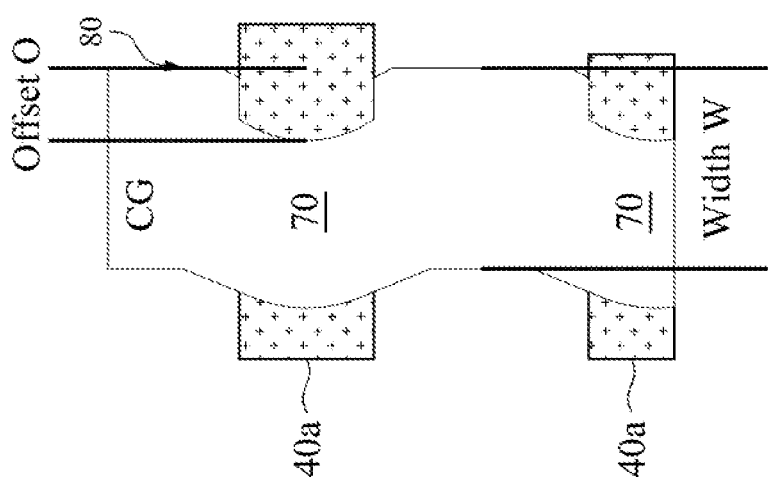
FIG. 13 shows a top view of an enlarged portion of the simplified top view of the flash memory with control gate lines shown in FIG. 1(B) with dimensions for defining an indentation fraction.

With reference to FIGS. 13 and 14, by way of nonlimiting illustration dimensions are shown for defining the offset ratio for the embodiment of FIGS. 1(B) and 8 (see FIG. 13), and for defining the offset ratio for the embodiment of FIG. 9 (see FIG. 14). The Offset ratio is suitably defined as:

$$OffsetRatio = \frac{O}{W} \quad (2)$$

where, as seen in FIGS. 13 and 14, the parameter W denotes the width of the control line CG and the parameter O denotes the indentation distance. In some nonlimiting illustrative embodiments, the offset ratio $$\frac{O}{W}$$

is at least 5%

$$\left(i.e, \frac{O}{W} \geq 0.05\right).$$

In some nonlimiting illustrative embodiments, the offset ratio $$\frac{O}{W}$$

is between 5% and 50%

$$\left(i.e., 0.05 \leq \frac{O}{W} \leq 0.50\right)$$

for the first, second, and fourth embodiments of respective FIGS. 1, 9, and 11. In some nonlimiting illustrative embodiments, the offset ratio $$\frac{O}{W}$$

is between 5% and 20%

$$\left(i.e., 0.05 \leq \frac{O}{W} \leq 0.20\right)$$

for the third embodiment of FIG. 10. The lower upper limit for the third embodiment is motivated by maintaining a sufficiently high coupling ratio, since increasing the indentation size O decreases the capacitance $C_{ONO}$ and consequently decreases the coupling ratio.

The illustrative embodiments employ split gate flash memory cells in which there are two control gate lines CG on opposite sides of the common source region CS. However, it will be appreciated that the disclosed approaches for suppressing floating gate bridging can be applied in other types of flash memory. For example, if the flash memory does not employ a common source topology, then each cell may have its own source region, so that each source region line has a single corresponding control gate line. In this case, there will be only one control gate line with a non-straight edge proximate to the source region that is indented away from the source region at least where the control gate line is disposed over the isolation strips separating flash memory cells of the linear array of flash memory cells.

In the following, some further embodiments are described.

In a nonlimiting illustrative embodiment, a flash memory is disclosed. The flash memory includes a linear array of split gate flash memory cells including a common source region extending along a first direction. Each split gate flash memory cell includes a first floating gate disposed on a first side of the common source region and a second floating gate disposed on a second side of the common source region opposite the first side. The flash memory further includes first isolation strips extending along a second direction transverse to the first direction and disposed between the split gate flash memory cells on the first side of the common source region, and second isolation strips extending along the second direction and disposed between the split gate flash memory cells on the second side of the common source region. An erase gate line extends along the first direction and is disposed over the common source region. A first control gate line extends along the first direction on the first side of the common source region and is disposed over the first isolation strips and over the first floating gates of the split gate flash memory cells. The first control gate line has a non-straight edge proximate to the common source region that is indented away from the common source region at least where the first control gate line is disposed over the first isolation strips. A second control gate line extends along the first direction on the second side of the common source region and is disposed over the second isolation strips and over the second floating gates of the split gate flash memory cells. The second control gate line has a non-straight edge proximate to the common source region that is indented away from the common source region at least where the second control gate line is disposed over the second isolation strips.

In a nonlimiting illustrative embodiment, a flash memory comprises: a linear array of flash memory cells including a source region extending along a first direction, each flash memory cell including a floating gate disposed adjacent the source region, the linear array of flash memory cells further including isolation strips disposed between the floating gates of the flash memory cells; an erase gate line extending along the first direction and disposed over the source region; and a control gate line extending along the first direction and disposed over the isolation strips and over the floating gates of the flash memory cells. The control gate line has a non-straight edge proximate to the source region that is indented away from the source region at least where the control gate line is disposed over the isolation strips.

In a nonlimiting illustrative embodiment, a method of manufacturing a flash memory is disclosed. Shallow trench isolation (STI) regions are formed in a base material. A common source region is formed, extending along a first direction in the base material. A floating gate layer is formed on the base material. A control gate layer is formed on the floating gate layer and on the STI regions. Photolithographically patterned etching of the control gate layer and the floating gate layer is performed to form first and second control gate lines from the control gate layer and first and second floating gates from the floating gate layer. The formed first control gate line extends along the first direction on a first side of the common source region and is disposed on the first floating gates and on the STI regions between the first floating gates. The formed second control gate line extends along the first direction on a second side of the common source region opposite the first side and is disposed on the second floating gates and on the STI regions between the second floating gates. The photolithographically patterned etching forms a non-straight edge of the first control gate line proximate to the common source region that is indented away from the common source region at least where the first control gate line is disposed over the STI regions between the first floating gates, and a non-straight edge of the second control gate line proximate to the common source region that is indented away from the common source region at least where the second control gate line is disposed over the STI regions between the second floating gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory comprising:
    a linear array of split gate flash memory cells including a common source region extending along a first direction, each split gate flash memory cell including a first floating gate disposed on a first side of the common source region and a second floating gate disposed on a second side of the common source region opposite the first side;
    first isolation strips extending along a second direction transverse to the first direction and disposed between the split gate flash memory cells on the first side of the common source region;
    second isolation strips extending along the second direction and disposed between the split gate flash memory cells on the second side of the common source region;
    an erase gate line extending along the first direction and disposed over the common source region including being disposed over the portions of the common source region extending between adjacent split gate flash memory cells of the linear array of split gate flash memory cells;
    a first control gate line extending along the first direction on the first side of the common source region and disposed over the first isolation strips and over the first floating gates of the split gate flash memory cells, the first control gate line having a non-straight edge proximate to the common source region that is indented away from the common source region at least where the first control gate line is disposed over the first isolation strips; and
a second control gate line extending along the first direction on the second side of the common source region and disposed over the second isolation strips and over the second floating gates of the split gate flash memory cells, the second control gate line having a non-straight edge proximate to the common source region that is indented away from the common source region at least where the second control gate line is disposed over the second isolation strips.

2. The flash memory of claim 1, wherein at least one of:
(i) the first control gate line includes bent portions that bend away from the common source region where the first control gate line crosses the first isolation strips, and/or
(ii) the second control gate line includes bent portions that bend away from the common source region where the second control gate line crosses the second isolation strips.

3. The flash memory portion of claim 1, wherein at least one of:
the first control gate line includes an offset portion that is offset away from the common source region where the first control gate line crosses the linear array of flash memory cells, and/or
the second control gate line includes an offset portion that is offset away from the common source region where the second control gate line crosses the linear array of flash memory cells.

4. The flash memory of claim 1, wherein at least one of:
the non-straight edge of the first control gate line has notches where the first control gate line crosses the first isolation strips and the first control gate line further has a straight edge distal from the common source region, and/or
the non-straight edge of the second control gate line has notches where the second control gate line crosses the second isolation strips and the second control gate line further has a straight edge distal from the common source region.

5. The flash memory of claim 1, wherein at least one of:
the non-straight edge of the first control gate line has a notch where the first control gate line crosses the linear array of flash memory cells, and/or
the non-straight edge of the second control gate line has a notch where the second control gate line crosses the linear array of flash memory cells.

6. The flash memory of claim 1, wherein the erase gate line comprises polycrystalline silicon, the first and second control gate lines comprise polycrystalline silicon, and the first and second isolation strips comprise shallow trench isolation.

7. The flash memory of claim 6, further comprising:
a p-type base material on which the common source region, the first floating gates, and the second floating gates are disposed, the common source region being n-type;
insulating layers interposed between the first floating gates and the p-type base material;
insulating layers interposed between the second floating gates and the p-type base material;
insulating layers interposed between the first control gate line and the first floating gates;
insulating layers interposed between the second control gate line and the second floating gates; and
an insulating layer interposed between the erase gate line and the common source region.

8. The flash memory of claim 1, wherein:
the indentation of the non-straight edge of the first control gate line is at least 5% of a width of the first control gate line; and
the indentation of the non-straight edge of the second control gate line is at least 5% of a width of the second control gate line.

9. A flash memory comprising:
a linear array of flash memory cells including a common source region extending along a first direction, each flash memory cell including a first floating gate disposed adjacent the source region and a second floating gate disposed adjacent the common source region on an opposite side from the first floating gate, the linear array of flash memory cells further including first isolation strips extending along a second direction transverse to the first direction and disposed between the first floating gates of the flash memory cells, and second isolation strips extending along the second direction and disposed between the second floating gates of the flash memory cells;
an erase gate line extending along the first direction and disposed over the common source region; and
a first control gate line extending along the first direction and disposed over the first isolation strips and over the first floating gates of the flash memory cells;
a second control gate line extending along the first direction and disposed over the second isolation strips and over the second floating gates of the flash memory cells;
wherein each of the first and second control gate lines has a non-straight edge proximate to the common source region that is indented away from the common source region where the control gate line crosses the linear array of flash memory cells.

10. The flash memory of claim 9, wherein the erase gate line comprises polycrystalline silicon, the first and second control gate lines comprises polycrystalline silicon, and the first and second isolation strips comprise shallow trench isolation.

11. The flash memory portion of claim 9, wherein each of the first and second control gate lines includes an offset portion that is offset away from the common source region where the control gate line crosses the linear array of flash memory cells.

12. The flash memory of claim 9, further comprising:
a p-type base material on which the common source region and the floating gates are disposed, the common source region being n-type;
insulating layers interposed between the first and second floating gates and the p-type base material;
insulating layers interposed between the first and second control gate lines and the respective first and second floating gates; and
an insulating layer interposed between the erase gate line and the common source region.

13. The flash memory of claim 9, wherein the non-straight edge of each of the first and second control gate lines has a notch where the control gate line crosses the linear array of flash memory cells.

14. The flash memory of claim 9, wherein the indentation of the non-straight edge of each of the first and second control gate lines is at least 5% of a width of the control gate line.

15. A flash memory comprising:
- shallow trench isolation (STI) regions formed in a base material;
- a common source region extending along a first direction in the base material;
- first floating gates disposed on the base material;
- second floating gates disposed on the base material;
- a first control gate line that extends along the first direction on a first side of the common source region and is disposed on the first floating gates and on the STI regions between the first floating gates;
- a second control gate line that extends along the first direction on a second side of the common source region opposite the first side and is disposed on the second floating gates and on the STI regions between the second floating gates; and
- an erase gate line extending along the first direction and disposed over the common source region;
- wherein a non-straight edge of the first control gate line proximate to the common source region is indented away from the common source region at least where the first control gate line is disposed over the STI regions between the first floating gates, and a non-straight edge of the second control gate line proximate to the common source region is indented away from the common source region at least where the second control gate line is disposed over the STI regions between the second floating gates; and
- wherein the first control gate line has a straight edge distal from the common source region and the second control gate line has a straight edge distal from the common source region.

16. The flash memory of claim 15, wherein the erase gate line comprises polycrystalline silicon and the first and second control gate lines comprise polycrystalline silicon.

17. The flash memory of claim 15, wherein the indentation of the non-straight edge of the first control gate line is at least 5% of a width of the first control gate line, and the indentation of the non-straight edge of the second control gate line is at least 5% of a width of the second control gate line.

18. The flash memory of claim 15, wherein at least one of:
- the non-straight edge of the first control gate line has notches where the first control gate line crosses the STI regions between the first floating gates, and/or
- the non-straight edge of the second control gate line has notches where the second control gate line crosses the STI regions between the second floating gates.

19. The flash memory of claim 15, wherein at least one of:
- the non-straight edge of the first control gate line has a notch where the first control gate line crosses the first floating gates and the STI regions between the first floating gates, and/or
- the non-straight edge of the second control gate line has a notch where the second control gate line crosses the second floating gates and the STI regions between the second floating gates.

20. The flash memory of claim 15, wherein:
- the base material is a p-type well;
- the common source region is n-type;
- the first and second floating gates comprise a layer stack including an insulator and a polysilicon floating gate; and
- the first and second control gates include an insulator and a polysilicon control gate.

* * * * *